United States Patent [19]

Kanamaru

[11] Patent Number: 5,397,999
[45] Date of Patent: Mar. 14, 1995

[54] EVALUATION APPARATUS FOR POWER SUPPLY SYSTEM

[75] Inventor: Kouji Kanamaru, Zama, Japan
[73] Assignee: PFU Limited, Kahoku, Japan
[21] Appl. No.: 921,081
[22] Filed: Jul. 29, 1992

[30] Foreign Application Priority Data

Aug. 9, 1991 [JP] Japan .................. 3-200224

[51] Int. Cl.⁶ .......................................... G01R 31/00
[52] U.S. Cl. .................... 324/771; 324/158.1
[58] Field of Search ............... 324/430, 158 R, 72.5, 324/510, 511, 415, 670, 158.1, 771

[56] References Cited

U.S. PATENT DOCUMENTS 4,357,574  11/1982  Takamisawa et al. ............ 324/72.5
4,926,281  5/1990  Murphy .............................. 324/415

FOREIGN PATENT DOCUMENTS 0017608  10/1980  European Pat. Off.
2155257  9/1985  United Kingdom.
2167869  6/1986  United Kingdom.
2213600  8/1989  United Kingdom.

OTHER PUBLICATIONS

Barnes, Brady, "Insert Boards Into A Live System Without Any Hitches–A Hot Backplane Can Easily Be Tamed By Implementing Some Simple, Practical Solutions," *Electronic Design*, May 11, 1989, pp. 75–80.

*Primary Examiner*—Ernest F. Karlsen
*Attorney, Agent, or Firm*—Staas & Halsey

[57] ABSTRACT

In an evaluation apparatus for measuring the fluctuation of a voltage and a current on a power supply line and evaluating the result of the measurement, the apparatus includes: a dummy load connected to the power supply line instead of an actual function unit to measure the fluctuation of the voltage and the current on the power supply line; and a switch connected to the dummy load for turning ON/OFF the dummy load instead of performing an inserting/removing operation thereof. Further, the above switch can replace to a switching control circuit connected to the dummy load for continuously switching turning ON/OFF state of the dummy load instead of repeatedly performing an inserting-/removing operation of the dummy load.

6 Claims, 9 Drawing Sheets

DUMMY LOAD

EVALUATION APPARATUS FOR POWER SUPPLY SYSTEM

BACKGROUND OF THE INVENTION

1. Field of the Invention

The present invention relates to an evaluation apparatus for a power supply system; more particularly, it relates to an evaluation apparatus for measuring the fluctuation of a power supply line caused by insertion thereto or removal therefrom of any one function unit during the operation of a computer system, i.e., during the ON state of the power source of the computer system, and for evaluating the result of said measurement.

2. Description of the Related Art

Recently, there are many users who are requiring non-stop operation of a computer system, because they want to provide more services to customers for a whole day. Accordingly, the power source of such a computer system must be always turned ON.

In one kind of a computer system formed by, for example, a common power source and plural function units each connected in parallel to the common power source through a common back panel and a power supply line, any one function unit is removed from the back panel, or a new function unit is inserted thereto when the user intends to change the function of the computer system or when a failure occurs in any one of the function units.

In the above case, it is necessary for the user to insert or to remove the function unit without a cut-off of the power source, thereby to satisfy the requirement of nonstop operation of the computer system.

As is obvious, the voltage and current of the power supply line fluctuates at the moment of insertion or removal of the function unit, and a current rush, or surge, flows to the function unit at that moment. Accordingly, it is necessary to measure such fluctuation of the power supply line and to evaluate the result of the measurement so as to utilize the resultant data in a design of the computer system.

SUMMARY OF THE INVENTION

The object of the present invention is to provide an evaluation apparatus for a power supply system enabling easy measurement of the fluctuation of the voltage and current on the power supply line.

In accordance with one aspect of the present invention, there is provided an evaluation apparatus for measuring the fluctuation of voltage and current on a power supply line and evaluating the result of the measurement, including:

a dummy load connected to the power supply line, instead of an actual function unit, to measure the fluctuation of the voltage and current on the power supply line; and a switch connected to the dummy load for turning ON/OFF the dummy load instead of inserting/removing operation thereof.

In a preferred embodiment, the dummy load includes: a capacitive load; a resistive load connected in parallel formation to the capacitive load; a current control circuit connected to the loads for controlling a current to the loads; and a time constant circuit connected to the current control circuit for controlling the current to the current control circuit.

In another preferred embodiment, the dummy load includes: a capacitive load; a resistive load connected parallel to the capacitive load; a current control circuit connected to the loads for controlling a current to the loads; a time constant circuit connected to the current control circuit for controlling the current to the current control circuit; and a load voltage setting circuit connected between the current control circuit and the loads for setting the voltage across the loads.

In still another embodiment, the load voltage setting circuit has a resistor connected in series to the loads.

In accordance with another aspect of the present invention, there is provided an evaluation apparatus for measuring the fluctuation of voltage and current on a power supply line and evaluating the result of the measurement, including;

a dummy load connected to the power supply line instead of an actual function unit to measure fluctuation of the voltage and current on the power supply line; and a switching control circuit connected to the dummy load for continuously switching turning ON/OFF state of the dummy load instead of repeatedly performing an inserting/removing operation of the dummy load.

In a preferred embodiment, the dummy load includes: plural capacitive load modules connected parallel to each other to adjust the value of the capacitive load; plural resistive load modules connected parallel to the capacitive load modules and connected in parallel to each other to adjust the value of the resistive load; a current control circuit connected to the load modules for controlling a current to the load modules; and a time constant circuit connected to the current control circuit for controlling the current to the current control circuit.

In another preferred embodiment, the switching control circuit includes; a first switch for a single pulse mode; a second switch for a continuous pulse mode; an oscillator for generating a continuous clock signal; three D-type flip-flop circuits for shifting the turning ON signal from the first switch in response to the clock signal from the first switch in response to the clock signal from the oscillator; a J-type flip-flop circuit for generating an inverted clock signal in response to the clock signal from the oscillator; a first NAND gate connected to the first switch through the D-type flip-flop circuits; and a second NAND gate connected to the second switch and the J-type flip-flop circuit.

BRIEF DESCRIPTION OF THE DRAWINGS

In the drawings:

FIG. 9 is a view explaining a change of the current in accordance with a change of the time constant when the switch is turned ON;

DESCRIPTION OF PREFERRED EMBODIMENTS

Before describing the preferred embodiments, the explanation of a conventional art will be provided below.

Figure 1:
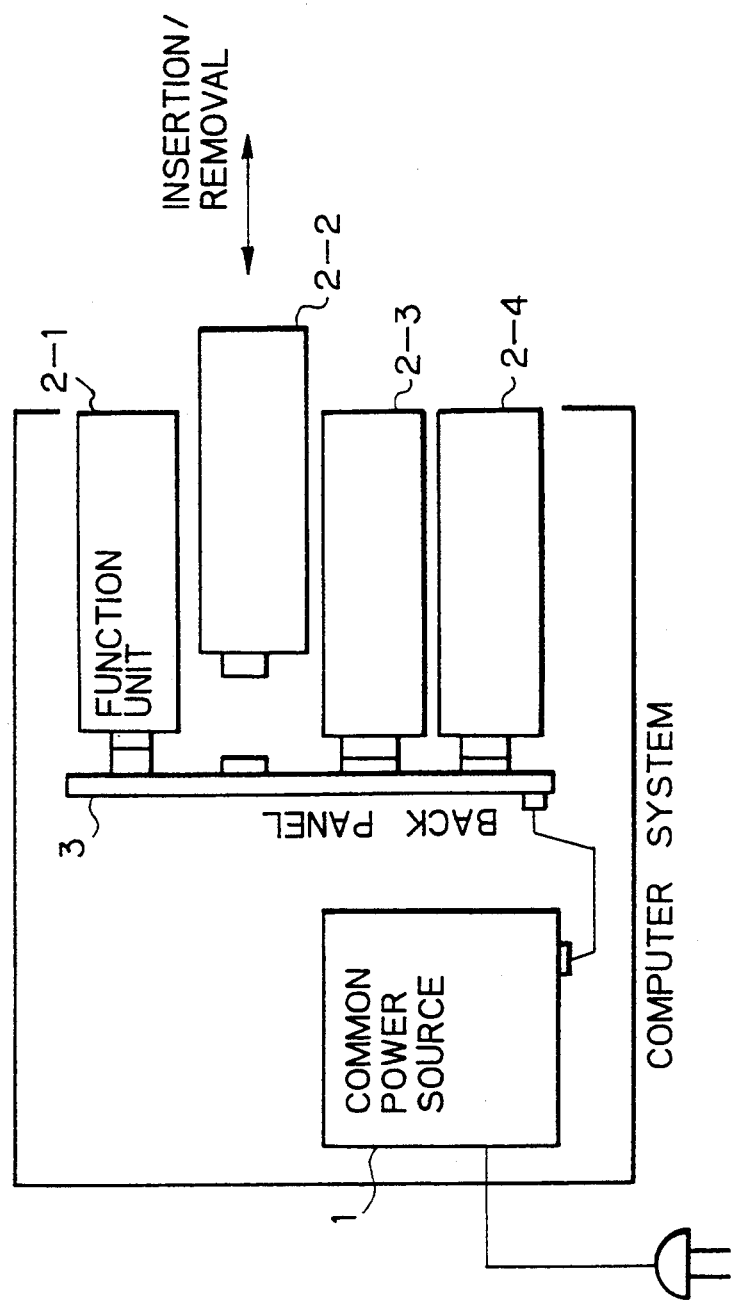
FIG. 1 is a schematic block diagram of a computer system having one common power source and plural function units.

FIG. 1 is a schematic block diagram of a computer system having one common power source and plural function units. As shown in the drawing, the computer system comprises the common power source 1, plural function units 2-1 to 2-4, and the back panel 3. The function units 2-1 to 2-4 are connected parallel to the common power source 1 through the back panel 3. Any one of the function units, for example, the function unit 2—2, is removed from or inserted to the back panel when a failure occurs in the system or when a user intends to change the related function of the system. In this case, removal or insertion of the function unit must be performed without a cut-off of the common power source, thereby to provide sufficient service to the user.

Figure 2:
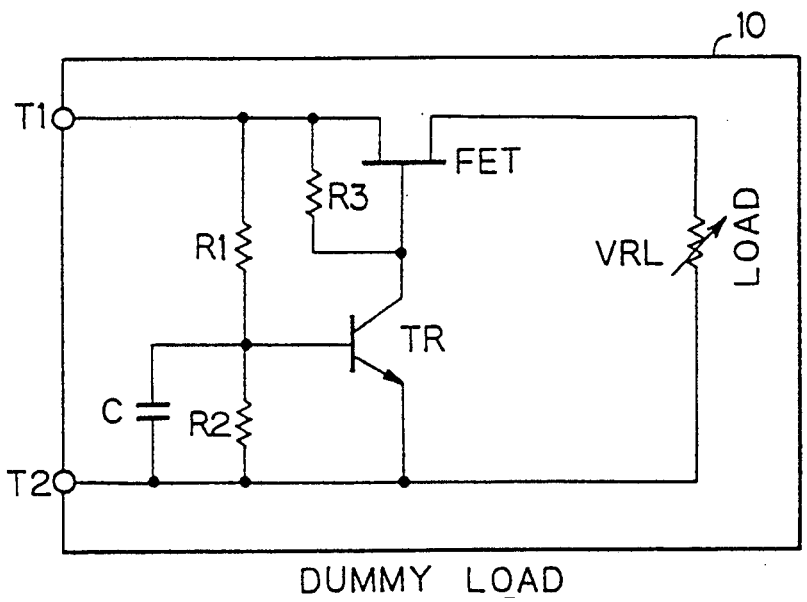
FIG. 2 shows a dummy load for measuring the fluctuation of a power supply line in a conventional art.

FIG. 2 shows a dummy load for measuring the fluctuation of the power supply line in a conventional art. This dummy load 10 is inserted into or removed from the back panel 3, instead of the function unit 2—2, thereby to measure the fluctuation of the voltage and current on the power supply line. As shown in the drawing, the dummy load has a variable resistor VRL as the load. That is, this dummy load comprises only a resistive load.

In this circuit, the transistor TR is turned ON in accordance with the time constant of the capacitor C and the resistor R2. That is, when the voltage of the base of the transistor is raised to a predetermined level in accordance with the time constant, the transistor TR is turned ON. When the transistor TR is turned ON, the FET transistor is turned ON so that the current flows to the variable resistor VRL. The value of the resistor VRL is adjusted so as to measure the current flowing from the power supply line to this dummy load. In the drawing, terminals T1 and T2 are connection points to the power supply line through the back panel.

As mentioned above, this dummy load is formed by the resistive load VRL so that it is possible to measure the fluctuation of the voltage and current of the power supply line when the resistor VRL is changed. In actual practice, however, the function unit has a power by-pass condenser connected in parallel with the load so that a large rush current, or current serge, flows from the power supply line to the by-pass condenser upon the insertion of the function unit. Accordingly, it is necessary to measure the fluctuation caused by the rush current, and the actual function unit is used to measure the fluctuation of the power supply line caused by the rush current as explained below.

Figure 3:
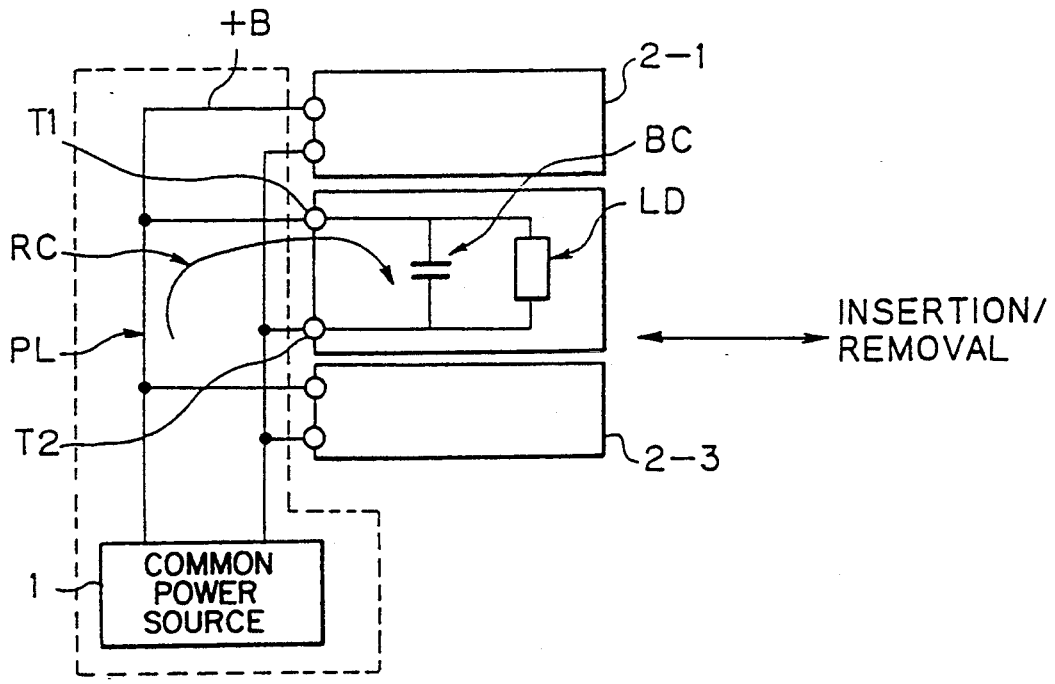
FIG. 3 is a view explaining the actual function unit to measure the fluctuation of the power supply line in the conventional art.
Figure 4:
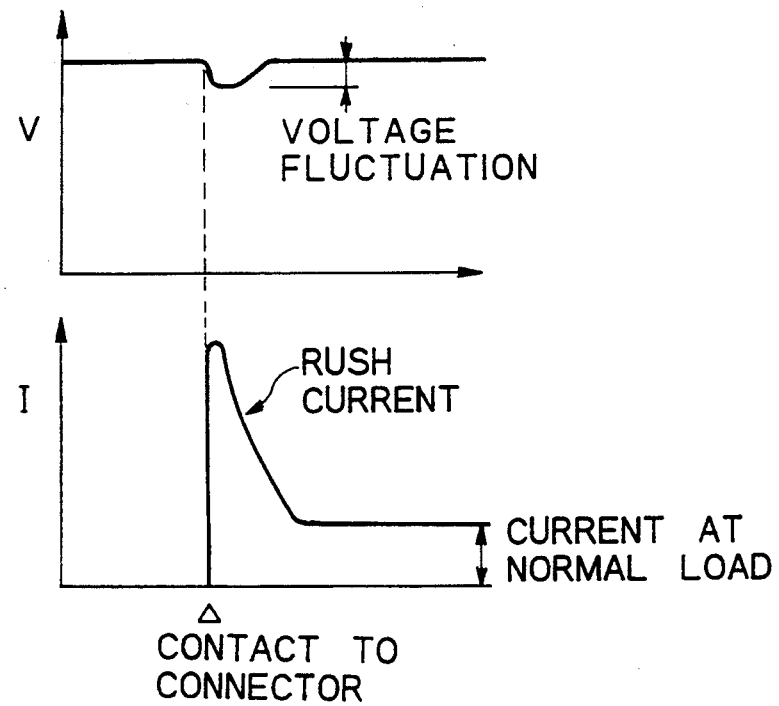
FIG. 4 is a view explaining the fluctuation of the voltage and rush current in FIG. 3.

FIG. 3 is a view explaining the actual function unit, as employed to measure the fluctuation of the power supply line in the conventional art, and FIG. 4 is a view explaining the fluctuations of voltage and rush current which occur in FIG. 3. In general, the function unit has the power by-pass condenser BC and the load LD connected in parallel to with the condenser. When the function unit is inserted into the back panel 3, the large rush current RC (shown by an arrow) flows from the common power source 1 to the by-pass condenser BC through power supply line PL.

When the function unit is inserted into the back panel and as shown in FIG. 4, the large rush current flows from the power source 1 to the by-pass condenser BC through the power supply line PL so that the voltage of the power supply line PL fluctuates at that moment. In this case, for example, the fluctuation of the voltage is required to be limited to of 5V±10% for electric parts for an IC circuit. Accordingly, it is necessary to measure the fluctuation of the power supply line to the above extent.

When the actual function unit is used to measure the fluctuation of the power supply line, there are some problems as explained below. These problems are caused mainly by the handling operation when inserting or removing the function unit.

(1) The function unit is manually inserted to or removed from the back panel so that much time is necessary to measure the fluctuation of the power supply line because many handling processes are necessary to perform the measurement.

(2) There are many dispersions when manually inserting into or removing from the function unit so that it is difficult to precisely evaluate the result of measurement.

(3) In a connector provided in the back panel, since the function unit is repeatedly inserted into or removed from the connector, the connection points of the connector deteriorate.

Figure 5:
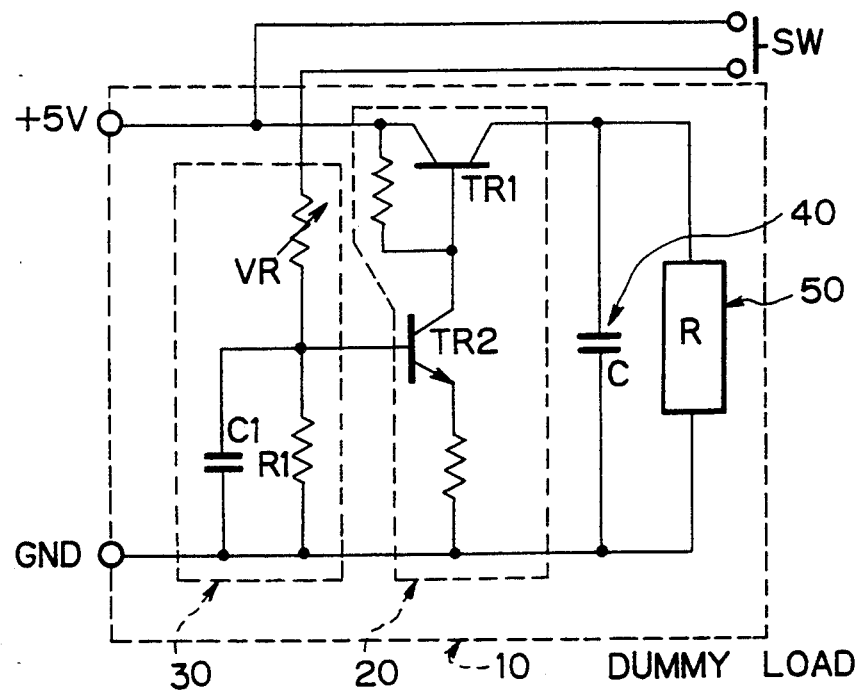
FIG. 5 is a circuit diagram of a dummy load according to one embodiment of the present invention.

FIG. 5 is a circuit diagram of a dummy load according to one embodiment of the present invention. In FIG. 5, reference number 10 denotes a dummy load, 20 a current control circuit, 30 a time constant circuit, 40 a capacitive load (C), and 50 a resistive load (R). Further, SW denotes a switch.

The dummy load 10 includes the current control circuit 20 for controlling the current flowing from the power supply line PL to the capacitive load 40 and the resistive load 50, and the time constant circuit 30 for controlling the current flowing the current control circuit 20. The switch SW is provided for controlling the ON/OFF of the current control circuit 20.

Briefly, in the present invention, the dummy load 10 is inserted into the back panel 3, i.e., connected to the power supply line, to measure the fluctuation of the voltage and the current on the power supply line PL, and the switch SW is turned ON. The current flows from the current control circuit 20 to the capacitive load 40 and the resistive load 50 in accordance with the time constant of the time constant circuit 30, and the fluctuation of the power supply line is measured. Further, after the voltage across both loads 40 and 50 is set to an optional value by flowing the current through the current control circuit 20, the current flows from the current control circuit 20 to the capacitive and resistive loads 40 and 50 in accordance with the time constant to measure the fluctuation of the power supply line. Still further, the current control circuit 20 is controlled by the switch SW to turn ON/OFF once, or to continuously turn ON/OFF in accordance with a desired operation thereof.

As shown in the drawing, the current control circuit 20 is formed by transistors TR1, TR2 and the resistors. The time constant circuit 30 is formed by a variable resistor VR, a resistor R1 and a capacitor C1.

Figure 6:
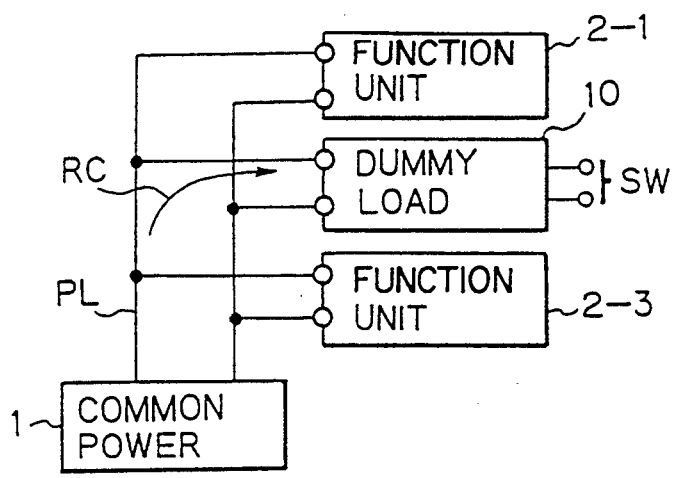
FIG. 6 shows a system structure to measure the fluctuation of the power supply line.
Figure 7:
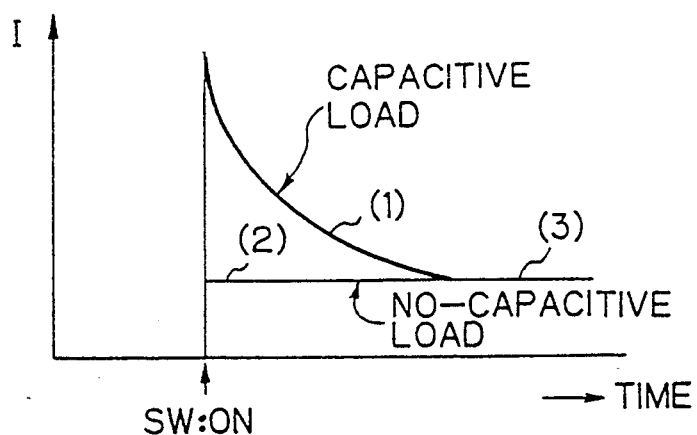
FIG. 7 is a view explaining a change of the current in accordance with the capacitive load.
Figure 8:
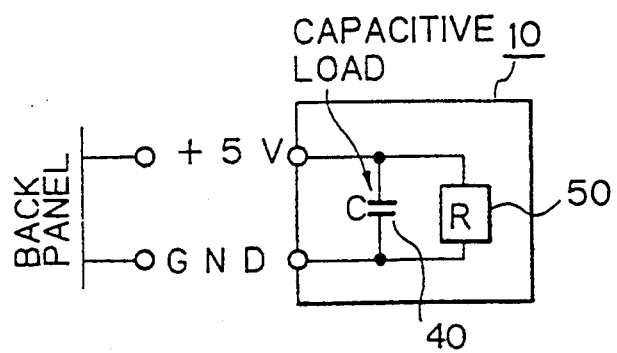
FIG. 8 shows the capacitive load and the resistive load.
Figure 9:
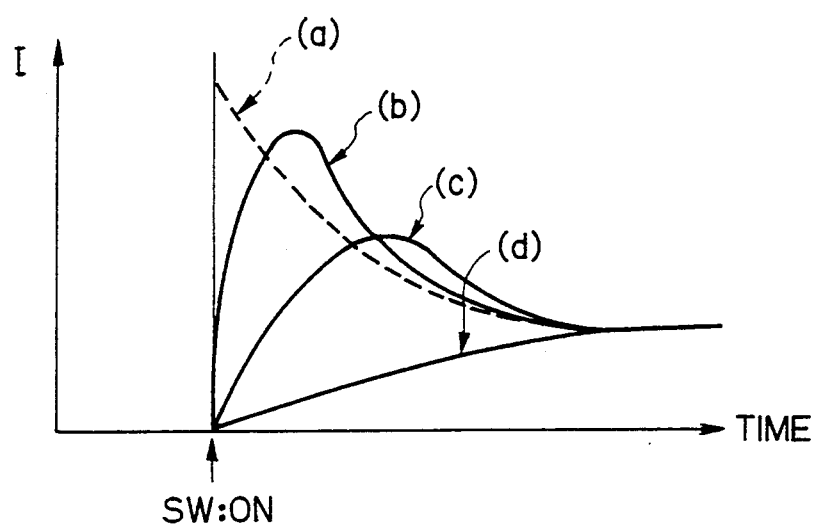
Figure 10:
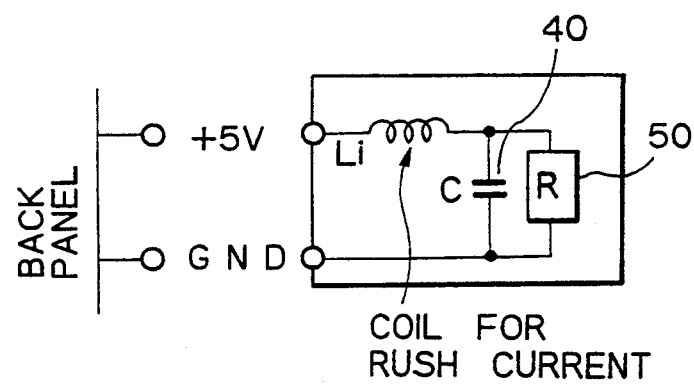
FIG. 10 shows a coil for preventing a rush current.

FIG. 6 shows a system structure to measure the fluctuation of the power supply line, FIG. 7 is a view explaining a change of the current in accordance with the capacitive load, FIG. 8 shows the capacitive load and the resistive load, FIG. 9 is a view explaining a change of the current in accordance with the change of the time constant when the switch is turned ON, and FIG. 10 shows a coil for preventing a rush current.

The time constant is determined based on the values of the capacitor C1, the resistor R1 and the variable resistor VR in the time constant circuit 30 (FIG. 5). Particularly, the time constant is adjusted by the variable resistor VR as shown in FIG. 9.

The capacitive load 40 corresponds to the actual capacitance of the function unit, i.e., the power by-pass condenser BC shown in FIG. 3. As shown in FIG. 5, since the capacitive load 40 is provided in the dummy load 10, it is possible to measure the fluctuation of the power supply line in a state similar to the actual by-pass condenser. Further, the resistive load 50 corresponds to the resistive load LD of the actual function unit.

The switch SW is provided for realizing the same operation as the inserting/removing operation. That is, the turning ON of the switch SW corresponds to the inserting operation of the function unit to the back panel, and the turning OFF of the switch SW corresponds to the removing operation of the function unit.

In FIG. 6, after the dummy load 10 is inserted into the power supply line PL through the back panel, the switch SW is turned ON to measure the fluctuation of the power supply line PL. As explained above, it is possible to realize a state similar to the insertion/removal of the dummy load 10 by turning ON/OFF the switch SW.

In FIG. 7, the curve (1) denotes the change of the current when the capacitive load 40 is provided, and the curve (2) denotes the change of the current when the capacitive load 40 is not provided. As shown in the drawing, when the switch SW is turned ON, the current (1) is initially high and rapidly reduces to the level of the constant current (3) because the capacitor 40 is initially discharged.

In FIG. 8, the capacitor C corresponds to the condenser 40 of FIG. 5, and the resistor R corresponds to the resistor 50 of FIG. 5. As explained above, the capacitor C corresponds to the power by-pass condenser in the actual function unit.

In FIG. 9, the curve (a) indicated by a dotted line is such that the time constant is zero, i.e., in the case that the condenser C1 is not provided (or the variable resistor VR is very small) and the coil Li for the rush current shown in FIG. 10 is not provided. The curves (b), (c), and (d) correspond to a small time constant, a medium time constant, and a large time constant, respectively. Further, in the case of the curves (b), (c) and (d), the coil Li for the rush current is provided as shown in FIG. 10. As shown in these curves, the rush current can be changed in accordance with the change of the time constant. In this case, the time constant is adjusted by the variable resistor VR. Accordingly, to measure fluctuation of the power supply line, the time constant is changed by the variable resistor VR in accordance with the curves (b), (c) and (d). In this case, the coil Li is provided.

The operation of the circuit shown in FIG. 5 will be explained in detail below.

First, the dummy load 10 is mounted to the back panel 3 (i.e., power supply line PL) instead of the actual function unit. Next, the values of the capacitive load 40 and the resistive load 50 are set to the coproximate values of the actual function unit. Further, in the case that the coil Li for the rush current is provided, the variable resistor VR is adjusted in accordance with the curves (b) to (d).

In the above state, when the switch SW is turned ON, the transistor TR2 is turned ON in response to the voltage from the time constant circuit 30, and the transistor TR1 is turned ON in response to the voltage from the transistor TR2 so that the current flows from the current control circuit 20 to the loads 40 and 50. Further, the time constant is adjusted in accordance with the curves (b) to (d) to measure the fluctuation of the power supply line.

Figure 11:
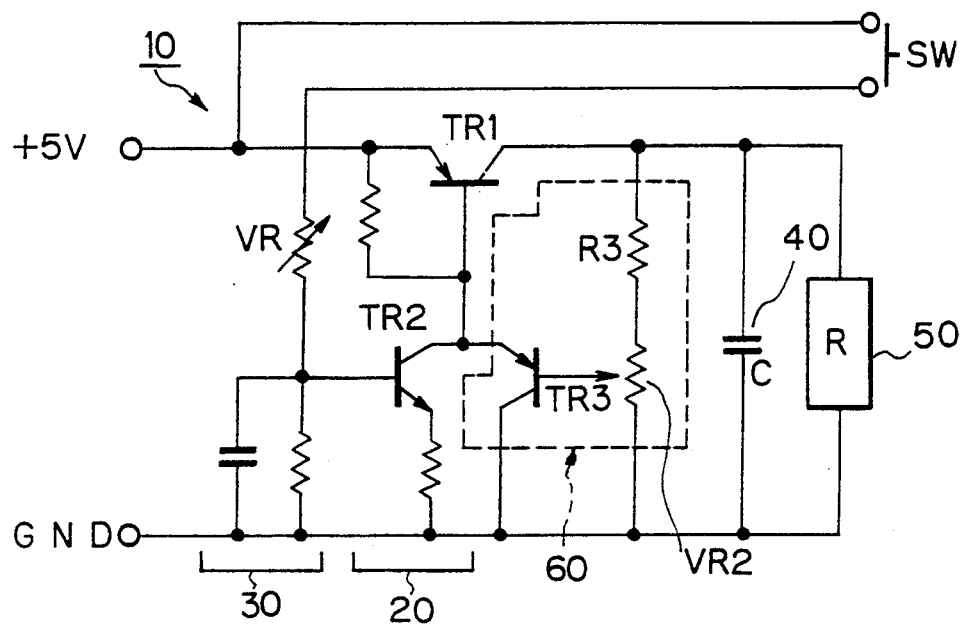
FIG. 11 is a circuit diagram of a dummy load according to another embodiment of the present invention.

FIG. 11 is a circuit diagram of a dummy load according to another embodiment of the present invention. In the drawing, reference number 60 denotes a load voltage setting circuit. This circuit 60 is formed by a transistor TR3 connected to the transistor TR2, a resistor R3, and a variable resistor VR2. Further, the load voltage setting circuit 60 supplies a predetermined voltage to the capacitive load 40 and the resistive load 50 by adjusting the variable resistor VR2.

Figure 13:
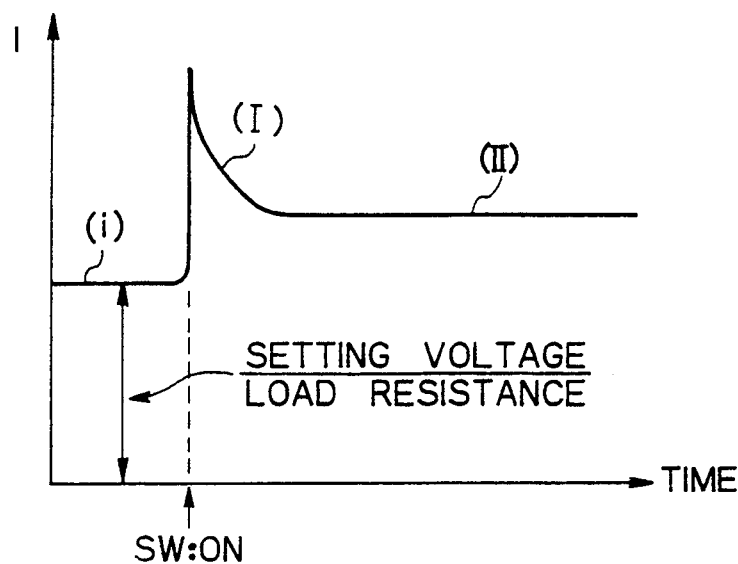
FIG. 13 is a view explaining the current flowing to the loads when the load voltage setting circuit is provided.

The capacitive load 40 is previously charged by the voltage from the load voltage setting circuit 60 before the switch SW is turned ON. Next, when the switch SW is turned ON, the current flows to the loads 40 and 50 as shown in FIG. 13. That is, initially, the rush current flows to the loads 40 and 50 as shown by the curve (I), and next, the constant current flows to the loads 40 and 50 as shown by (II). Accordingly, it is possible to measure the fluctuation of the power supply line.

Figure 12:
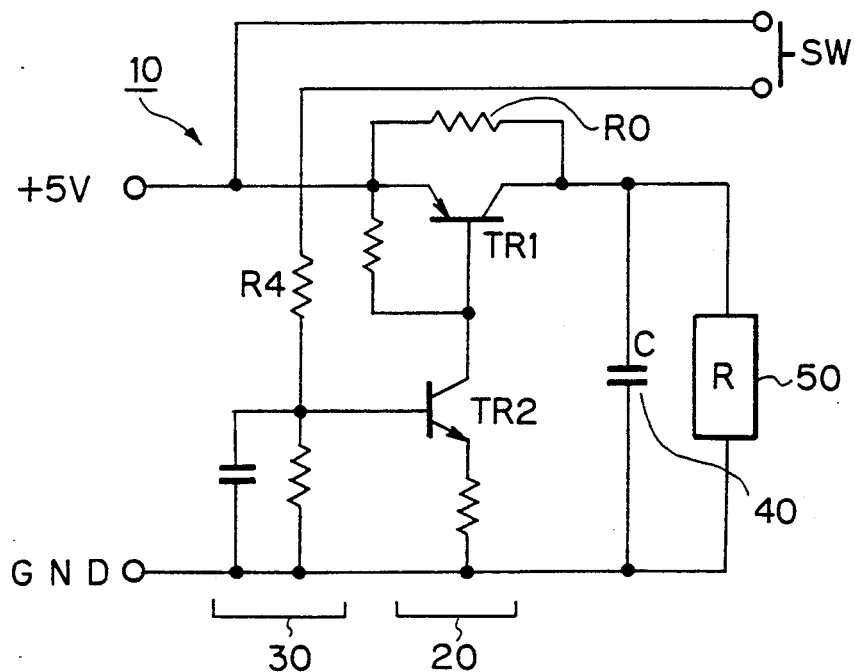
FIG. 12 shows another embodiment of the load voltage setting circuit.

FIG. 12 shows another embodiment of the load voltage setting circuit. In this case, the load voltage setting circuit is shown by only one resistor RO, which is connected across the transistor TR1. The voltage determined by the sum of the resistor RO and the resistive load 50 is supplied to the capacitive load 40 and the resistive load 50. As explained above, the capacitive load 40 is previously charged by the voltage determined by the sum of the resistor RO and the resistive load 50 before the switch SW is turned ON.

Next, when the switch SW is turned ON, the current flows to the loads 40 and 50 as shown in FIG. 13. That is, initially, the rush current flows to the loads 40 and 50 as shown by the curve (I), and next, the constant current flows to the loads 40 and 50 as shown by the curve (II). Accordingly, it is possible to measure the fluctuation of the power supply line.

FIG. 13 is a view explaining the current flowing to the loads 40 and 50 when the load voltage setting circuit 60 is provided. That is, the capacitive load 40 is previously charged by the constant current (see, current (i)) before the switch SW is turned OFF. When the switch SW is turned ON, the large current flows initially as shown by the curve (I), then, the constant current flows to the load.

Figure 14:
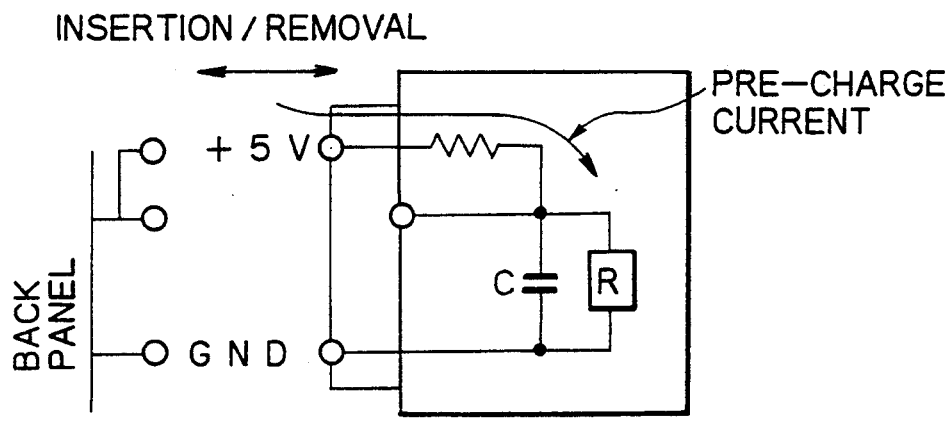
FIG. 14 is a view explaining the current flowing to the function unit in the inserting/removing operation.

FIG. 14 is a view explaining the current flowing to the function unit in the insertion/removal operation. The current corresponds to the curves (i), (I) and (II).

Figure 15:
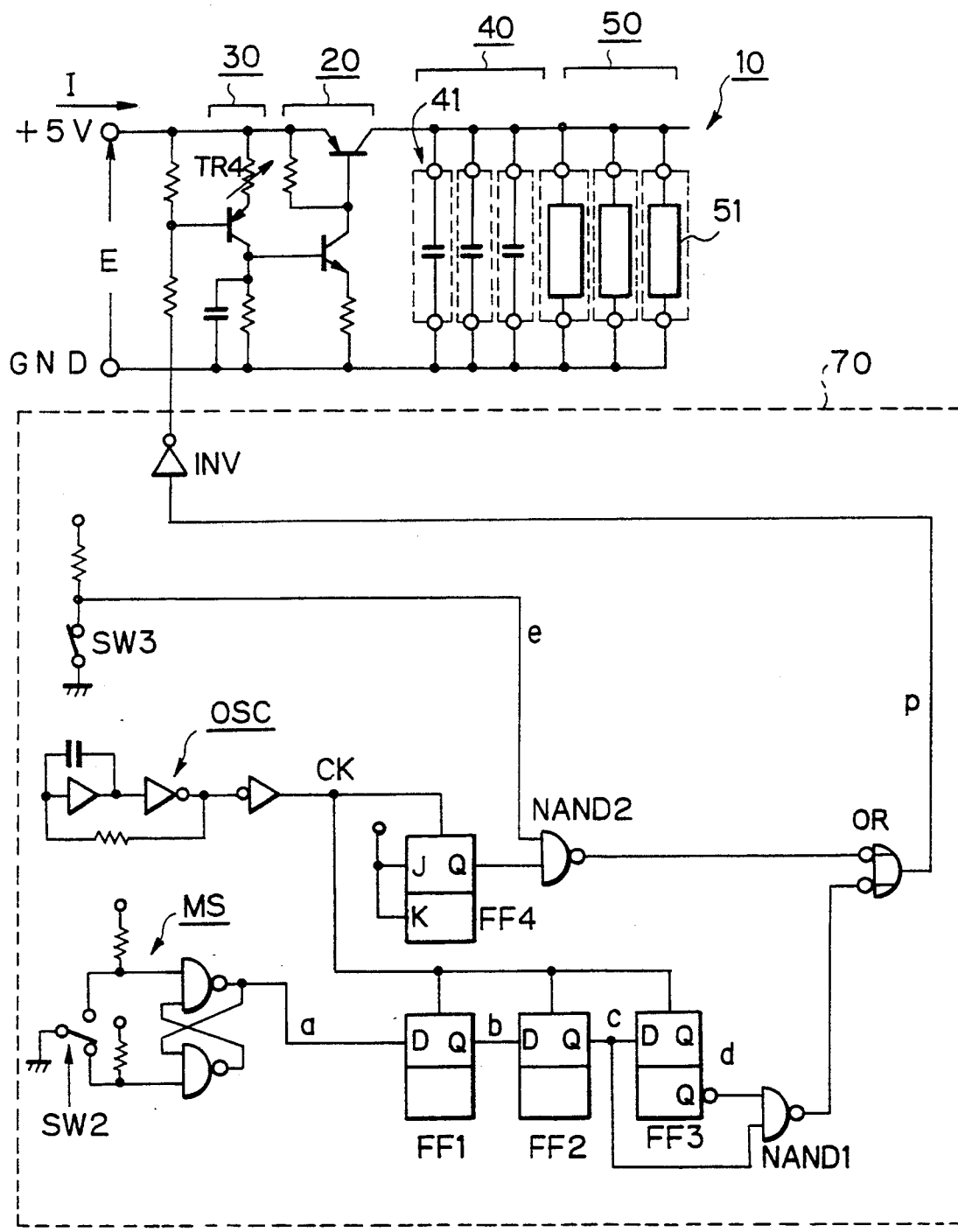
FIG. 15 shows still another embodiment of the present invention.

FIG. 15 shows still another embodiment of the present invention. In FIG. 15, reference number 70 denotes a switching control circuit that is connected to the time constant circuit 30 of the dummy load 10 instead of the switch SW. That is, the switch SW is not provided in this embodiment and the switching control circuit 70 is provided to easily perform inserting/removing operation of the function unit.

In this embodiment, the capacitive load 40 is formed by plural capacitive load modules 41, and the resistive load 50 is formed by plural resistive load modules 51. In this case, when measuring the fluctuation of the power supply line, it is possible to easily set the value of the capacitive load and the resistive load by adjusting the number of modules.

The switching control circuit 70 includes a first switch SW2, a second switch SW3, an oscillator OCS, plural flip-flop circuits FF1 to FF4, NAND gates 1, 2, and an OR gate. The first switch SW2 denotes a single pulse mode switch to generate an ON or OFF signal to the time constant circuit 30, and the second switch SW3 denotes a continuous pulse mode switch to periodically generate the ON or OFF signal to the time constant circuit 30. The flip-flop circuits FF1 to FF3 denote D-type flip-flop circuits, and the flip-flop circuit FF4 denotes a J-type flip-flop circuit. Further, the oscillator OSC denotes a digital oscillator. The single pulse mode switch SW2 is included in a mono-stable circuit MS formed by NAND gates. INV denotes an inverter.

Figure 16:
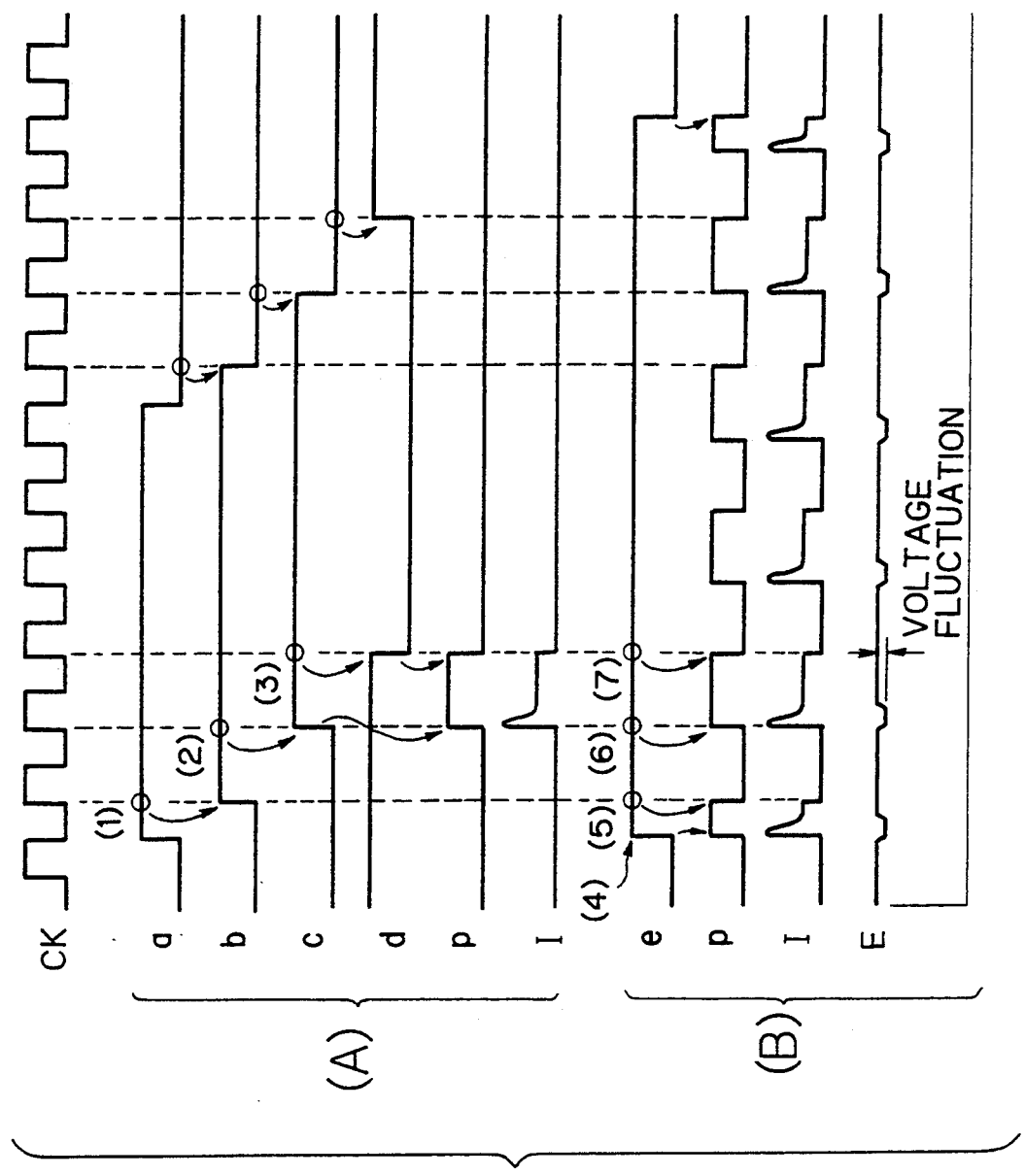
FIG. 16 is a signal timing chart for the switching control circuit.

FIG. 16 is a signal timing chart for the switching control circuit 70. In the timing chart, (A) is such that the single pulse mode switch SW2 is turned ON, and (B) is such that the continuous pulse mode switch SW3 is turned ON. Further, (a) to (e) denote output signals from each circuits, "P" denotes an output signal from the OR gate, and CK denotes clock signals from the oscillator OSC having a frequency of approximately 500 Hz and used for the synchronized operation of the switching control circuit 7.

In the case of

When the single pulse mode switch SW2 is turned ON, the mono-stable circuit MS generates the signal "a" as shown by (1). The signal "a" of a high level signal is sent to the flip-flop circuit FF1 which outputs the signal "b" of the high level signal synchronized with the clock CK as shown by (2). Similarly, the flip-flop circuit FF2 outputs the signal "c" of the high level signal as shown by (3), and the flip-flop circuit FF3 outputs the signal "d" of a low level signal. In this case, the signal "c" is also input to the NAND gate 1, and the signal "d" is inverted in the flip-flop circuit FF3.

As shown in the drawing, the signal "P" from the OR gate becomes high in the timing of (2), and becomes low in the next timing (3). The signal "P" becomes low after passing through the inverter INV, and this low level signal is input to a base of a transistor TR4 (PNP-type transistor) of the time constant circuit 30. Accordingly, the current I flows from +5 (V) to the ground GND in the time constant circuit 30, and further flows from the current control circuit 20 to the capacitive load 40 and resistive load 50.

When the signal "P" becomes low in the timing of (3), and is input to the base of the transistor TR4, the transistor TR4 is turned OFF and the time constant circuit 30 is cut off. Accordingly, the current flowing from the current control circuit 20 to the loads 40 and 50 can be stopped.

In the case of (B)

When the single pulse mode switch SW3 is turned ON, the signal "e" of the high level signal is input to the NAND gate 2. In the timing (4), the clock signal CK is input to the J-type flip-flop circuit FF4 so that the flip-flop circuit FF4 outputs the high level signal to the NAND gate 2. The signal "P" becomes high because the output of the NAND gate 2 becomes low and the output of the OR gate becomes high, and this high level signal is input to the invertor INV so that the base of the transistor TR4 becomes low. Accordingly, since the transistor TR4 is an N-type transistor, the transistor TR4 is turned ON and the current flows from the transistor TR4 to the invertor so that the time constant circuit 30 is turned ON. Accordingly, the current flows from the current control circuit 20 to the loads 40 and 50.

In the timing (5), when the next clock CK is input to the J-type flip-flop circuit FF4, the output of the J-type flip-flop circuit FF4 is inverted to a low level so that the output of the NAND gate becomes high and the signal "P" becomes low through the OR gate. When the signal "P" becomes low in the timing of (5) and the high level signal through the inverter INV is input to the base of the transistor TR4, the transistor TR4 is turned OFF and the time constant circuit 30 is cut off. Accordingly, the current flowing from the current control circuit 20 to the loads 40 and 50 can be stopped.

The operation in the timing (6) is the same operation as the timing (4). That is, the next clock signal CK is input to the J-type flip-flop circuit FF4 so that the flip-flop circuit FF4 outputs the high level signal to the NAND gate 2. The signal "P" becomes high and this high level signal is input to the inverter INV so that the base of the transistor TR4 becomes low. Accordingly, the transistor TR4 is turned ON and the current flows from the transistor TR4 to the inverter so that the time constant circuit 30 is ON. Accordingly, the current flows from the current control circuit 20 to the loads 40 and 50.

The operation in the timing (7) is the same operation as the timing (5). That is, when the next clock CK is input to the J-type flip-flop circuit FF4, the output of the J-type flip-flop circuit FF4 is inverted to the low level so that the output of the NAND gate becomes high and the signal "P" becomes low through the OR gate. When the signal "P" becomes low and the high level signal through the inverter INV is input to the base of the transistor TR4, the transistor TR4 is turned OFF and the time constant circuit 30 is cut off. Accordingly, the current flowing from the current control circuit 20 to the loads 40 and 50 can be stopped.

These operations of the timing (6) and (7) are repeated in the switching control circuit 70 so that it is possible to periodically flow the current to the dummy load 10 to measure the fluctuation of the voltage E and the current I on the power supply line PL. Accordingly, it is possible to measure the fluctuation of the power supply line PL when the actual function unit is inserted into or removed from the back panel and to evaluate the result of the measurement.

As explained above, in the present invention, the dummy load having the current control circuit, the time constant circuit, the capacitive load and the resistive load is connected to the power supply line (i.e., back panel) instead of the actual function unit, and the switch connected to the dummy load 10 is turned ON/OFF to realize an actual inserting/removing operation of the function unit. Accordingly, it is possible to easily measure the fluctuation of the power supply line and to evaluate the result of the measurement. The effect of the present invention is briefly described below.

(1) Since the operation is easy, i.e., only the turning ON/OFF of the switch, it is possible to easily measure the fluctuation of the power supply line and to evaluate the result of the measurement.

(2) Since the switching control circuit is provided, it is possible to easily measure the fluctuation of the power supply line many times.

(3) It is possible to realize the same state of measurement many times.

(4) It is possible to prevent the deterioration of the connector of the back panel since the dummy load is not repeatedly inserted into or removed from the connector.

(5) It is possible to use a general-type synchroscope without high grade measuring equipment having a storage function.

I claim:

1. An evaluation apparatus for measuring the fluctuation of a voltage and a current on a power supply line and evaluating the result of said measurement, comprising:
   a dummy load connected to the power supply line to measure the fluctuation of the voltage and the current on the power supply line, said dummy load comprising:
     a capacitive load,
     a resistive load connected in parallel with said capacitive load,
     a current control circuit, connected to said capacitive load and to said resistive load, which controls the current flow to said capacitive load and said resistive load, and
     a time constant circuit connected to said current control circuit for controlling the flow of current to said current control circuit; and
   a switch connected to said dummy load for turning ON/OFF said dummy load and thereby simulating an operation of inserting/removing the dummy load to and from the power supply line.

2. An evaluation apparatus as claimed in claim 1, wherein said dummy load further comprises:
   a load voltage setting circuit, connected between the current control circuit and the capacitive and resistive loads, which sets the voltage across the loads.

3. An evaluation apparatus as claimed in claim 2, wherein said load voltage setting circuit comprises a resistor connected in series to the loads.

4. An evaluation apparatus as recited in claim 1, wherein:
   said switch comprises a switching control circuit connected to said dummy load for continuously turning ON/OFF said dummy load and thereby changing the ON/OFF state of said dummy load and correspondingly thereby simulating continuous operations of inserting/removing the dummy load to and from the power supply line.

5. An evaluation apparatus as claimed in claim 5, wherein said dummy load further comprises:
   a plurality of parallel-connected capacitive load modules;
   a plurality of parallel-connected resistive load modules;
   a current control circuit connected to said plurality of parallel-connected capacitive load modules and said plurality of parallel-connected resistive load modules, said current control circuit controlling a current to said plurality of parallel-connected capacitive load modules and said plurality of parallel-connected resistive load modules; and
   a time constant circuit connected to said current control circuit which controls the current to said current control circuit.

6. An evaluation apparatus as claimed in claim 4, wherein said switching control circuit further comprises:
   a first switch which selects a single pulse mode;
   a second switch which selects a continuous pulse mode;
   an oscillator which generates a continuous clock signal;
   three D-type flip-flop circuits which shift an ON signal from said first switch in response to said clock signal from said oscillator;
   a J-type flip-flop circuit which generates an inverted clock signal in response to said clock signal from said oscillator;
   a first NAND gate connected to said first switch through said three D-type flip-flop circuits; and
   a second NAND gate connected to said second switch and to said J-type flip-flop circuit.

* * * * *

UNITED STATES PATENT AND TRADEMARK OFFICE
CERTIFICATE OF CORRECTION

PATENT NO. : 5,397,999
DATED : March 14, 1995
INVENTOR(S) : KANAMARU

It is certified that error appears in the above-indentified patent and that said Letters Patent is hereby corrected as shown below:

Col. 4, line 10, delete "to".

Col. 6, line 11, change "coproximate" to --approximate--.

Col. 7, line 44, after "In the case of" insert --(A)--.

Signed and Sealed this

Twenty-sixth Day of December, 1995

Attest:

BRUCE LEHMAN

*Attesting Officer*     *Commissioner of Patents and Trademarks*